US009553590B1

(12) United States Patent
Manohararajah et al.

(10) Patent No.: US 9,553,590 B1
(45) Date of Patent: Jan. 24, 2017

(54) CONFIGURING PROGRAMMABLE INTEGRATED CIRCUIT DEVICE RESOURCES AS PROCESSING ELEMENTS

(71) Applicant: Altera Corporation, San Jose, CA (US)

(72) Inventors: Valavan Manohararajah, Scarborough (CA); David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 246 days.

(21) Appl. No.: 13/662,795

(22) Filed: Oct. 29, 2012

(51) Int. Cl.
| | | |
|---|---|---|
| *H03K 19/177* | (2006.01) | |
| *H03K 19/173* | (2006.01) | |
| *G06F 9/30* | (2006.01) | |
| *G06F 7/57* | (2006.01) | |
| *G06F 7/38* | (2006.01) | |

(Continued)

(52) U.S. Cl.
CPC ......... *H03K 19/17708* (2013.01); *G06F 9/30* (2013.01); *H03K 19/1737* (2013.01); *G06F 17/30221* (2013.01); *G06F 17/5054* (2013.01); *H03K 19/17728* (2013.01); *H03K 19/17736* (2013.01)

(58) Field of Classification Search
CPC .................. H03K 19/17728; H03K 19/17736; H03K 19/1776; H03K 19/17732; G06F 17/5054; G06F 7/57; G06F 17/30221
USPC .............................. 326/37–41, 47
See application file for complete search history.

(56) References Cited

U.S. PATENT DOCUMENTS

| | | |
|---|---|---|
| 3,473,160 A | 10/1969 | Wahlstrom |
| 4,871,930 A | 10/1989 | Wong et al. |
| 5,122,685 A | 6/1992 | Chan et al. |

(Continued)

FOREIGN PATENT DOCUMENTS

| | | |
|---|---|---|
| EP | 0 419 105 | 3/1991 |
| EP | 0 461 798 | 12/1991 |

(Continued)

OTHER PUBLICATIONS

Case et al., "Design Methodologies for Core-Based FPGA Designs", Apr. 9, 1997, pp. 1-12.

(Continued)

*Primary Examiner* — Dylan White
(74) *Attorney, Agent, or Firm* — Fletcher Yoder, P.C.

(57) ABSTRACT

A programmable integrated circuit device includes a plurality of clusters of programmable logic resources. Programmable device interconnect resources allow user-defined interconnection between the clusters of programmable logic resources. A plurality of specialized processing blocks have dedicated arithmetic operators and programmable internal interconnect resources, and having inputs and outputs programmably connectable to the programmable device interconnect resources. A plurality of dedicated memory modules have inputs and outputs programmably connectable to the programmable device interconnect resources. Programmably connectable direct interconnect between at least one respective individual one of the specialized processing blocks and at least one respective individual one of the dedicated memory modules allow the formation of a processor element from a specialized processing block and a memory module. The specialized processing block may be designed with a datapath and operators arranged to support the configuring of a processor element.

24 Claims, 7 Drawing Sheets

(51) Int. Cl.
  *G06F 17/30* (2006.01)
  *G06F 17/50* (2006.01)

(56) References Cited

U.S. PATENT DOCUMENTS

| | | |
|---|---|---|
| 5,128,559 A | 7/1992 | Steele |
| 5,371,422 A | 12/1994 | Patel et al. |
| 5,483,178 A | 1/1996 | Costello et al. |
| 5,581,696 A | 12/1996 | Kolawa et al. |
| 5,689,195 A | 11/1997 | Cliff et al. |
| 5,724,583 A | 3/1998 | Carmon et al. |
| 5,754,459 A | 5/1998 | Telikepalli |
| 5,825,202 A | 10/1998 | Tavana et al. |
| 5,874,834 A | 2/1999 | New |
| 5,970,254 A | 10/1999 | Cooke et al. |
| 6,052,773 A | 4/2000 | DeHon et al. |
| 6,069,487 A | 5/2000 | Lane et al. |
| 6,075,935 A | 6/2000 | Ussery et al. |
| 6,091,262 A | 7/2000 | New |
| 6,094,065 A | 7/2000 | Tavana et al. |
| 6,211,697 B1 | 4/2001 | Lien et al. |
| 6,215,326 B1 | 4/2001 | Jefferson et al. |
| 6,346,824 B1 | 2/2002 | New |
| 6,407,576 B1 | 6/2002 | Ngai et al. |
| 6,457,116 B1 | 9/2002 | Mirsky et al. |
| 6,467,009 B1 | 10/2002 | Winegarden et al. |
| 6,519,753 B1 | 2/2003 | Ang et al. |
| 6,538,470 B1 | 3/2003 | Langhammer et al. |
| 6,556,044 B2 | 4/2003 | Langhammer et al. |
| 6,573,749 B2 | 6/2003 | New et al. |
| 6,578,133 B1 * | 6/2003 | Hyduke ............ G06F 15/8007 712/17 |
| 6,588,008 B1 | 7/2003 | Heddes et al. |
| 6,628,140 B2 | 9/2003 | Langhammer et al. |
| 6,745,369 B1 | 6/2004 | May et al. |
| 6,803,785 B1 | 10/2004 | May et al. |
| 7,315,918 B1 | 1/2008 | Yin |
| 7,859,302 B2 * | 12/2010 | Balasubramanian .. G01K 7/015 326/38 |
| 8,539,011 B1 * | 9/2013 | Taylor ............ H03K 19/17728 708/232 |
| 8,930,787 B1 * | 1/2015 | Jones ................ H03M 13/1515 714/752 |
| 9,218,156 B2 * | 12/2015 | Bates .................... G06F 7/4833 |
| 2005/0040850 A1 | 2/2005 | Schultz et al. |
| 2005/0257030 A1 | 11/2005 | Langhammer |
| 2011/0006805 A1 * | 1/2011 | Vorbach ............ G06F 15/7867 326/38 |
| 2011/0145547 A1 * | 6/2011 | Vorbach ............ G06F 9/30036 712/37 |

FOREIGN PATENT DOCUMENTS

| | | | |
|---|---|---|---|
| EP | 0 801 351 | 10/1997 | |
| EP | 2523095 A2 * | 11/2012 | ............ G06F 7/483 |
| GB | 2 283 602 | 5/1995 | |
| JP | 02-115957 | 4/1990 | |
| JP | 2-157957 | 6/1990 | |
| JP | 7-175784 | 7/1995 | |
| JP | 8-250685 | 9/1996 | |
| JP | 10-049510 | 2/1998 | |
| JP | 11-040522 | 2/1999 | |
| WO | WO 96/34346 | 10/1996 | |
| WO | WO 98/38741 | 9/1998 | |
| WO | WO 99/40552 | 8/1999 | |
| WO | WO 00/31652 | 6/2000 | |
| WO | WO 02/33504 | 4/2002 | |

OTHER PUBLICATIONS

"Computer Architecture—A Quantative Approach", Hennessy and Patterson, 1966, pp. 75 and 82.
"Excalibur Backgrounder", Altera, Jun. 2000, ver. 1, pp. 1-10.
"Implementing Logic with the Embedded Array in FLEX 10K Devices", *Altera*, May 2001, ver. 2.1, pp. 1-20.
"Implementing Multipliers in FLEX 10K EABs", *Technical Briefs*, Altera, Mar. 1996, pp. 1-2.
"Microsoft Computer Dictionary", *Microsoft* 1999, pp. 139 and 290.
Niedermeier, B., "Embedded-Processor Solutions for PLDs, Convergence of Programmable Technologies", *Elektronick*, Sep. 19, 2000, pp. 1-6.
"Processors drive (or dive) into programmable-logic devices", *EDN-Electrical Design News*, Cahners Publishing Co., Jul. 20, 2000, vol. 45, No. 15, pp. 107-108, 110, 112 and 114.
"QuickDSPTM Family Data Sheet", *Quicklogic*, Aug. 7, 2001, revision B, pp. 1-19.
Razdan et al., "A High-Performance Microarchitecture with Hardware-Programmable Functional Units", 1994, pp. 172-180.
"The QuickDSP Design Guide", *Quicklogic*, Aug. 2001, revision B, pp. 1-38.
"Virtex-II 1.5V Field-Programmable Gate Arrays", *Xilinx*, Apr. 2, 2001, module 1 of 4, pp. 1-7.
"Virtex-II 1.5V Field-Programmable Gate Arrays", *Xilinx*, Apr. 2, 2001, module 2 of 4, pp. 1-36.
"Virtex-II 1.5V Field-Programmable Gate Arrays", *Xilinx*, Jan. 25, 2001, module 2 of 4, pp. 1-50.
Wittig et al., "OneChip: An FPGA Processor with Reconfigurable Logic", *IEEE*, 1996, pp. 126-135.
"Xilinx Announces DSP Algorithms, Tools and Features for Virtex-II Architecture", *Xilinx*, Jun. 27, 2001, pp. 1-7.
"Xilinx Unveils New FPGA Architecture to Enable High-Performance, 10 Million System Gate Designs", *Xilinx*, Jun. 22, 2000, 11 pages.
Xilinx, "The Programmable Logic Data Book", Apr. 1998, pp. 4:5 and 4:18-21.

* cited by examiner

CONFIGURING PROGRAMMABLE INTEGRATED CIRCUIT DEVICE RESOURCES AS PROCESSING ELEMENTS

FIELD OF THE INVENTION

This invention relates to a programmable integrated circuit device, and particularly to using specialized processing blocks and memory as processing elements in a programmable integrated circuit device.

BACKGROUND OF THE INVENTION

Considering a programmable logic device (PLD) as one example of a programmable integrated circuit device, as applications for which PLDs are used increase in complexity, it has become more common to design PLDs to include specialized processing blocks in addition to blocks of generic programmable logic resources. Such specialized processing blocks may include a concentration of circuitry on a PLD that has been partly or fully hardwired to perform one or more specific tasks, such as a logical or a mathematical operation. A specialized processing block may also contain one or more specialized structures, such as an array of configurable memory elements. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), AND/NAND/OR/NOR arrays, etc., or combinations thereof.

One particularly useful type of specialized processing block that has been provided on PLDs is a digital signal processing (DSP) block, which may be used to process, e.g., audio signals (such as by Finite Impulse Response (FIR) filtering). Such blocks are also frequently referred to as multiply-accumulate ("MAC") blocks, because they include structures to perform multiplication operations, and sums and/or accumulations of multiplication results.

For example, PLDs sold by Altera Corporation, of San Jose, Calif., as part of the STRATIX®, ARRIA®, CYCLONE® and HARDCOPY® families include DSP blocks, each of which includes one or more multipliers. Each of those DSP blocks also includes one or more adders and registers, as well as programmable connectors (e.g., multiplexers) that allow the various components of the block to be configured in different ways. In addition, those DSP blocks can be configured for operation at different precisions.

Another type of specialized function that could be performed on a programmable integrated circuit device is that of a processor (e.g., a microprocessor).

One known possibility is to configure a processor from general-purpose programmable logic of a programmable integrated circuit device. The configuration of general-purpose programmable logic into a processor may be aided by the availability, from the programmable integrated circuit device manufacturer, or from others, of a "soft processor"—i.e., prerecorded configuration instructions for an efficient configuration of a processor on the programmable integrated circuit device. For example, the aforementioned Altera Corporation provides its customers with a soft processor "core" under the trademark NIOS® II.

Another known possibility is to provide dedicated processor circuitry on a portion of a programmable integrated circuit device. For example, the aforementioned Altera Corporation provides devices that may include dedicated ARM® processors from ARM Ltd., of Cambridge, England.

Both of these approaches may have drawbacks. For example, the soft processor approach consumes a substantial amount of the general-purpose logic resources of a device to instantiate the processor, leaving fewer resources for other user functions without moving to a larger device. On the other hand, while the dedicated processor approach consumes less device area than the soft processor approach, thereby leaving more general-purpose logic resources available on a device of a given size, the dedicated processor still consumes device area that a user, who does not need a processor, might prefer to see used for general-purpose logic resources.

SUMMARY OF THE INVENTION

In accordance with embodiments of the present invention, a small amount of additional circuitry may be added to a programmable integrated circuit device to allow specialized processing blocks such as the aforementioned DSP blocks to be combined with other specialized processing blocks such as the aforementioned memory blocks to form small processing elements. This approach consumes a minimum of device area while, for some user designs, avoiding the need to use a large amount of general-purpose logic resources for processor functions, and also avoiding the provision on the device of a dedicated processor that may not be used.

In embodiments of the invention, a programmable integrated circuit device, such as an FPGA, may include memory blocks (e.g., RAM blocks) and DSP blocks. In accordance with embodiments of the invention, programmable direct connections may be provided between the RAM blocks and the DSP blocks, which allows the RAM blocks and DSP blocks to function together as processing elements. If a user design does not call for processing elements, the direct connections would not be turned on, and the RAM blocks and DSP blocks could be used for their "traditional" uses as independent memories and arithmetic operators.

These embodiments offer several benefits. DSP blocks offer a highly area-efficient way of providing certain mathematical functions, and are commonly used in digital signal processing applications and other mathematics-intensive applications. However, for other applications, DSP blocks may be less useful. Embodiments of the present invention allow use of the DSP blocks for more general-purpose computational needs. Indeed, with some additional hardware such as a register file, a combination of memory blocks and DSP blocks might be used as a simple processor to execute a small program. Moreover, the dedicated links between the memory blocks and the DSP blocks may allow both to operate at speeds higher than would be otherwise possible if general purpose routing were used. Finally, embodiments of the present invention may allow certain types of components to be instantiated on a programmable integrated circuit device using a higher-level programming language rather than a hardware description language.

Therefore, in accordance with embodiments of the present invention there is provided a programmable integrated circuit device having a plurality of clusters of programmable logic resources, and programmable device interconnect resources allowing user-defined interconnection between the clusters of programmable logic resources. There also are a plurality of specialized processing blocks having dedicated arithmetic operators and programmable internal interconnect resources, and having inputs and outputs programmably connectable to the programmable device interconnect resources. A plurality of dedicated memory modules have inputs and outputs programmably connectable to the programmable device interconnect resources. There is a programmably connectable direct interconnect between at least one respective individual one of the specialized processing blocks and at least one respective individual one of the dedicated memory modules.

A method of configuring a processor element from a specialized processing block and a memory module of such a device also is provided. A specialized processing block designed to support the configuring of a processor element is provided as well.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

The logic fabric of known programmable integrated circuit devices, such as FPGAs, may include look-up tables (LUTs) and flip-flops (FFs) organized into clusters, arithmetic operators organized into DSP blocks, and embedded memories (e.g., RAMs). This known architecture offers a high degree of programmability. However, this architecture may suffer from a speed penalty, in that it is difficult to implement logic designs on such devices that are able to achieve speeds above 300 MHz. However, the embedded memories and DSP blocks can operate at much higher speeds—even in excess of 600 MHz. The pairing of memory blocks and DSP blocks into processing elements in accordance with this invention allows those processing elements to operate to perform computations at the higher rates that can be achieved by memory blocks and DSP blocks, even though the remainder of the device may operate at a slower rate.

In accordance with embodiments of the invention, memory blocks and DSP blocks may be interconnected by dedicated connections, along with some additional processing circuitry. The dedicated—although programmably connectable (because they will not always be used)—connections also may operate at higher speeds than the general-purpose routing of the programmable device, and therefore may further enhance the speed of the resulting processing element by helping to realize the potential presented by the higher operating speeds of the memory blocks and DSP blocks. Moreover, in the resulting processing element, memory is "local" to the computational elements that need it.

In addition, while programmable integrated circuit devices such as FPGAs traditionally have been programmed using hardware description languages (e.g., VHDL or Verilog), devices in accordance with embodiments of the invention may be more amenable to alternative programming styles, such as high-level-language programming. For example, SystemC, MATLAB and OpenCL, among others, view the hardware as being memories, registers, operators, and datapaths, and so could work well configuring processing elements according to the present invention, after the remainder of the device has been configured using a hardware description language.

Figure 1:
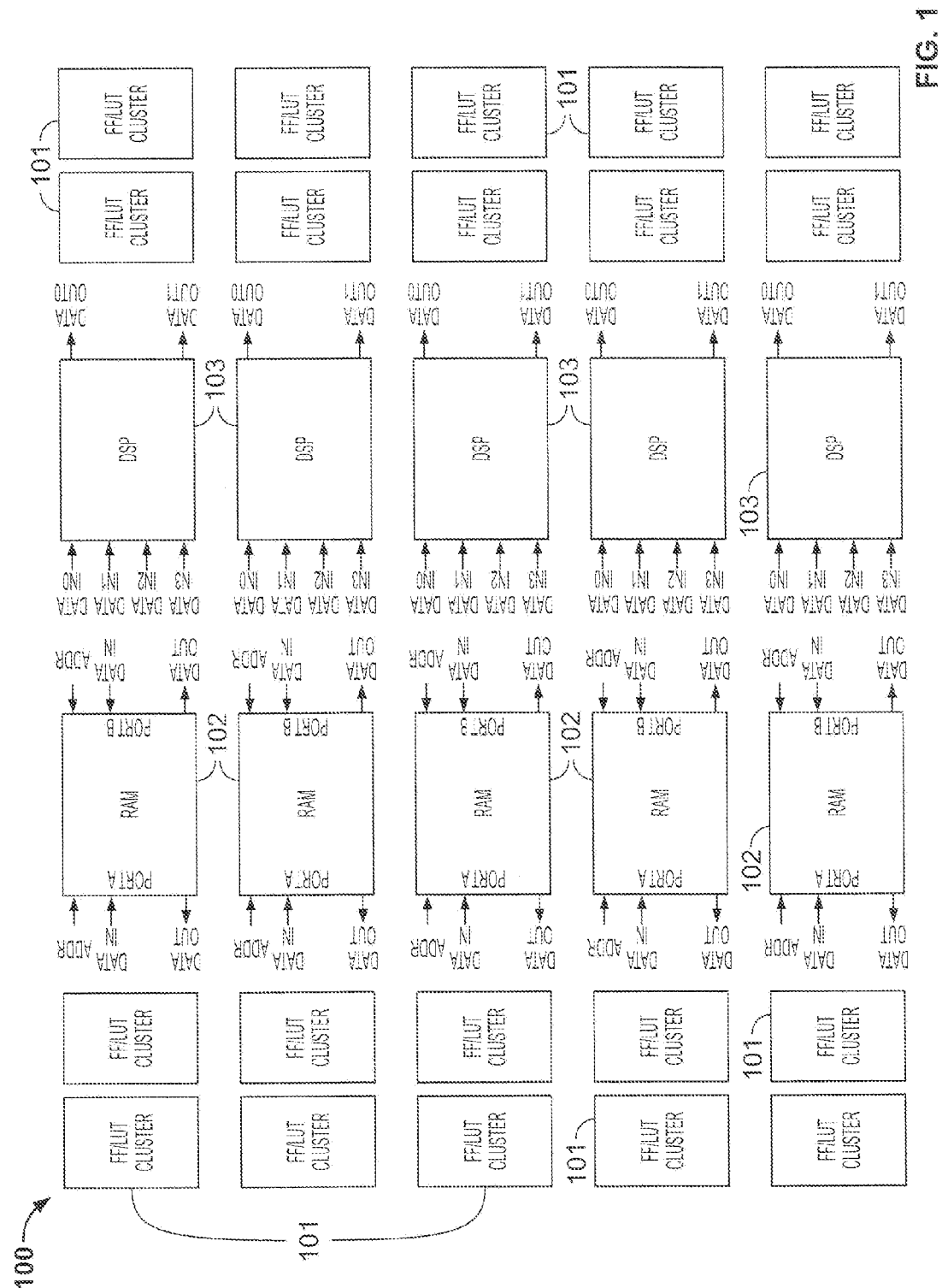
FIG. 1 shows a portion of a known programmable integrated circuit device architecture which can be adapted for use with the present invention.

FIG. 1 illustrates a portion of a known programmable integrated circuit device architecture 100, which can be adapted for use with the present invention. Device architecture 100 includes elements arranged in a conventional rectilinear row-and-column "floorplan," with columns of programmable FF/LUT clusters 101 (or other programmable logic elements) interspersed with columns of memory blocks 102 and columns of DSP blocks 103 (this partial representation shows one column of memory blocks 102 and one column of DSP blocks 103). Although the particular relative placement of memory blocks 102 and DSP blocks 103 may heretofore not have been important, device architecture 100 as shown is particularly well-suited for adaptation in accordance with the present invention, with the memory blocks 102 and DSP blocks 103 arranged in neighboring columns.

As is common in many known programmable integrated circuit devices, such as FPGAs, each memory block 102 may be a dual-ported RAM structure. Similarly, each DSP block 103 may take a number of inputs and produce a number of outputs. The memory blocks 102 and DSP blocks 103 may be configurable in a variety of ways to suit differing design needs. For example, a memory blocks 102 may offer a number of different width and depth options, and a DSP block 103 may offer a number of differing widths and internal functionality.

Figure 2:
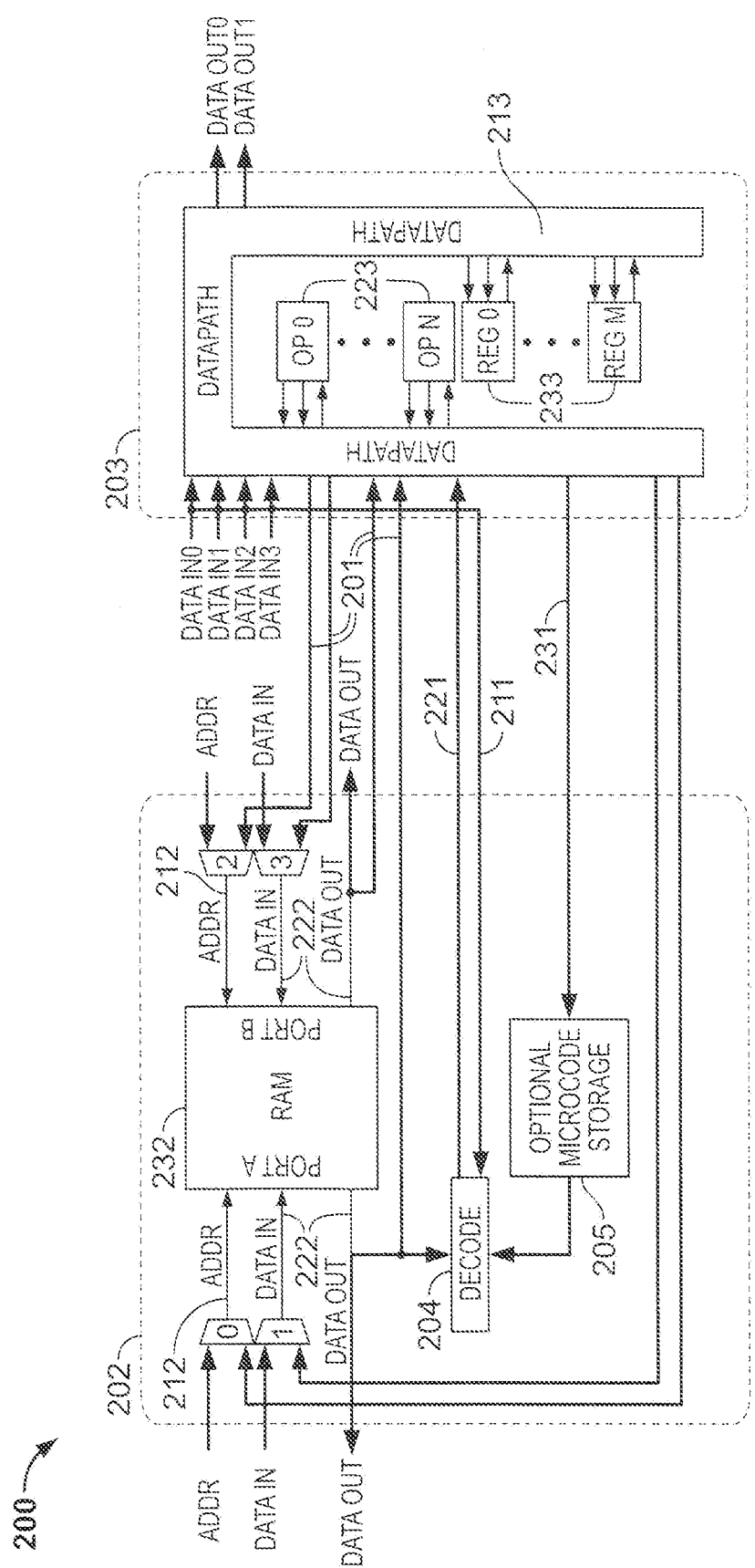
FIG. 2 shows one possible implementation of modifications allowing the combination of a memory block and a DSP block.

In accordance with embodiments of the present invention, programmable integrated circuit device architecture 100 is modified by adding the additional capability of pairing memory blocks 102 and DSP blocks 103 into processing elements. FIG. 2 illustrates one possible implementation 200 of modifications to realize the combination of a memory block 202 and a DSP block 203 to form a processing element. In FIG. 2, dedicated links 201 are provided between the datapath 213 of DSP block 203 and the address and data ports 212, 222 of memory block 202. An additional dedicated link 211 is provided between memory block 202 and at least a subset of the data inputs of DSP block 203. These dedicated links 201, 211 are in addition to conventional links into the general purpose routing resources of the programmable integrated circuit device.

Although DSP block 203 may be a conventional DSP block, in accordance with embodiments of the present invention, DSP block 203 may be organized as a datapath 213 connected to N operators 223 (OP0 . . . OPN). This arrangement allows DSP block 203 to support traditional DSP functions, as well as processor-type functions where the DSP operators 223 act in a sequence of operation. In addition, a set of M registers 233 (REG0 . . . REGM, where M may or may not be equal to N) may be added to DSP block 203, and also may be connected to datapath 213.

A decoder 204 may be provided to decode program instructions for execution by processing element 200, connected to DSP block 203 via links 211, 221. Those instructions may be stored in memory unit 232. Alternatively, optional microcode storage 205 may be provided, connected to datapath 213 by dedicated link 231. Even where microcode storage 205 is provided, its capacity would be limited compared to that of memory unit 232, and therefore microcode storage 205 typically would be used in cases where the number of instructions is limited (e.g., cases where there are only tens of instructions or fewer). However, when microcode storage 205 can be used, its tighter integration with decoder 204 could speed up execution.

Although decoder 204 and microcode storage 205 are shown as being part of memory block 202, that is not necessary. Decoder 204 and microcode storage 205 could just as easily be included in DSP block 203, or outside, but near, both memory block 202 and DSP block 203, although the connections to other components would be substantially the same as shown in FIG. 2. Indeed, it is not necessary that both decoder 204 and microcode storage 205 be located together. For example, one could be located in memory block 202, while the other is located in DSP block 203.

Similarly, although memory block 202 and DSP block 203 are shown in a horizontal relationship, it is not necessary that they be located on the same row in their respective columns on the programmable integrated circuit device. However, in order to avoid timing/latency issues, they should be close to one another—e.g., no more than two rows apart. Indeed, because links 201, 211, 221, 231 are programmable even though dedicated, a particular memory block 202 could have programmable dedicated links 201, 211, 221, 231 to more than one nearby DSP block 203, and vice-versa, subject to the foregoing restriction.

The arrangement shown in FIG. 2 can be used in at least four different modes, as described below in connection with FIGS. 3-6.

Figure 3:
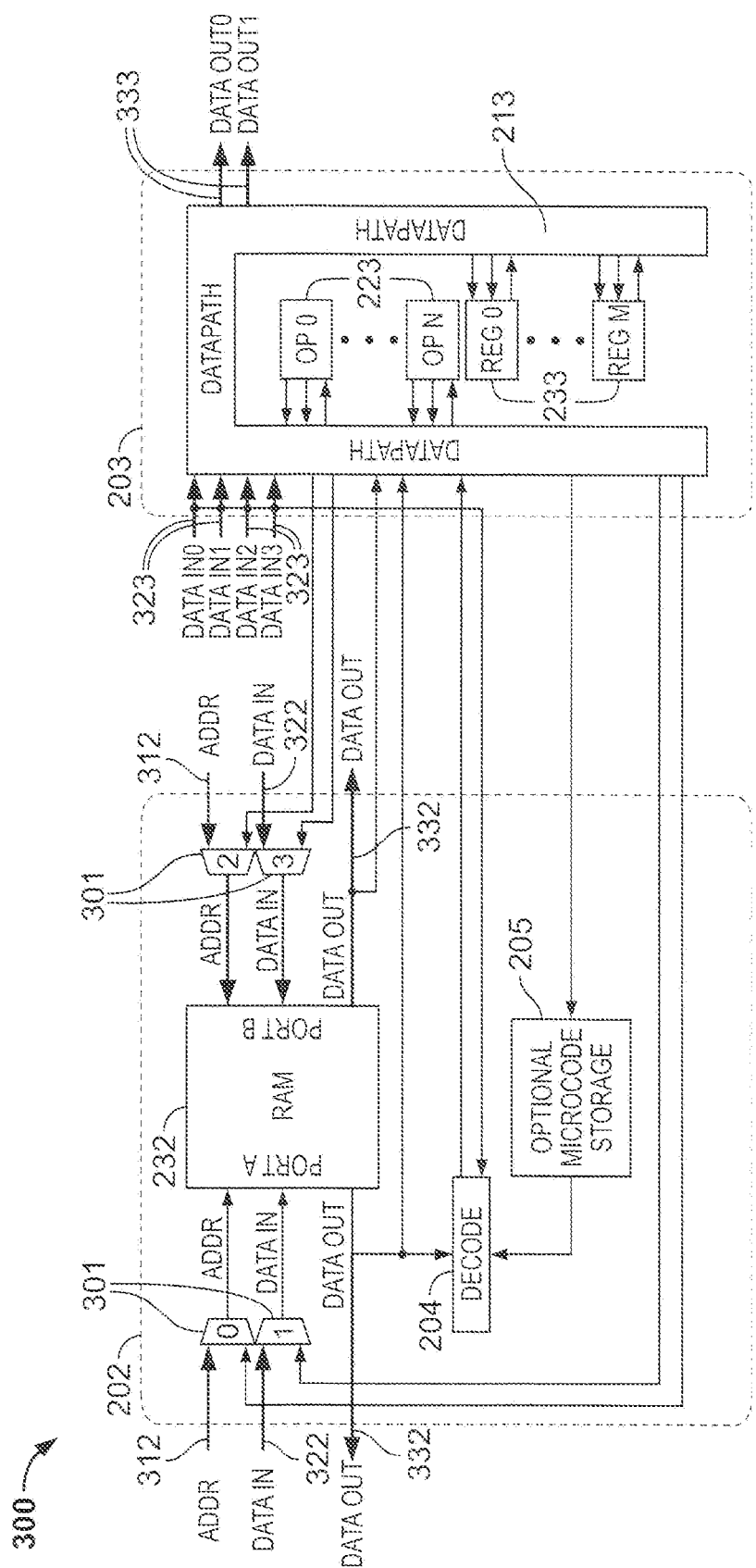
FIG. 3 shows a first example of a mode of operation of the structure of FIG. 2.

FIG. 3 shows how the structure of FIG. 2 is used conventionally, with memory block 202 separate from DSP block 203. In this mode 300, none of dedicated connections 201, 211, 221, 231 is used, nor is decoder 204 or microcode storage 205 used. Only the address, data input and data output paths 312, 322, 332 of memory block 202, and the data input and data output paths 323 and 333 of DSP block 203 are used. The selection of active paths for memory block 202 is made using multiplexers 301.

Figure 4:
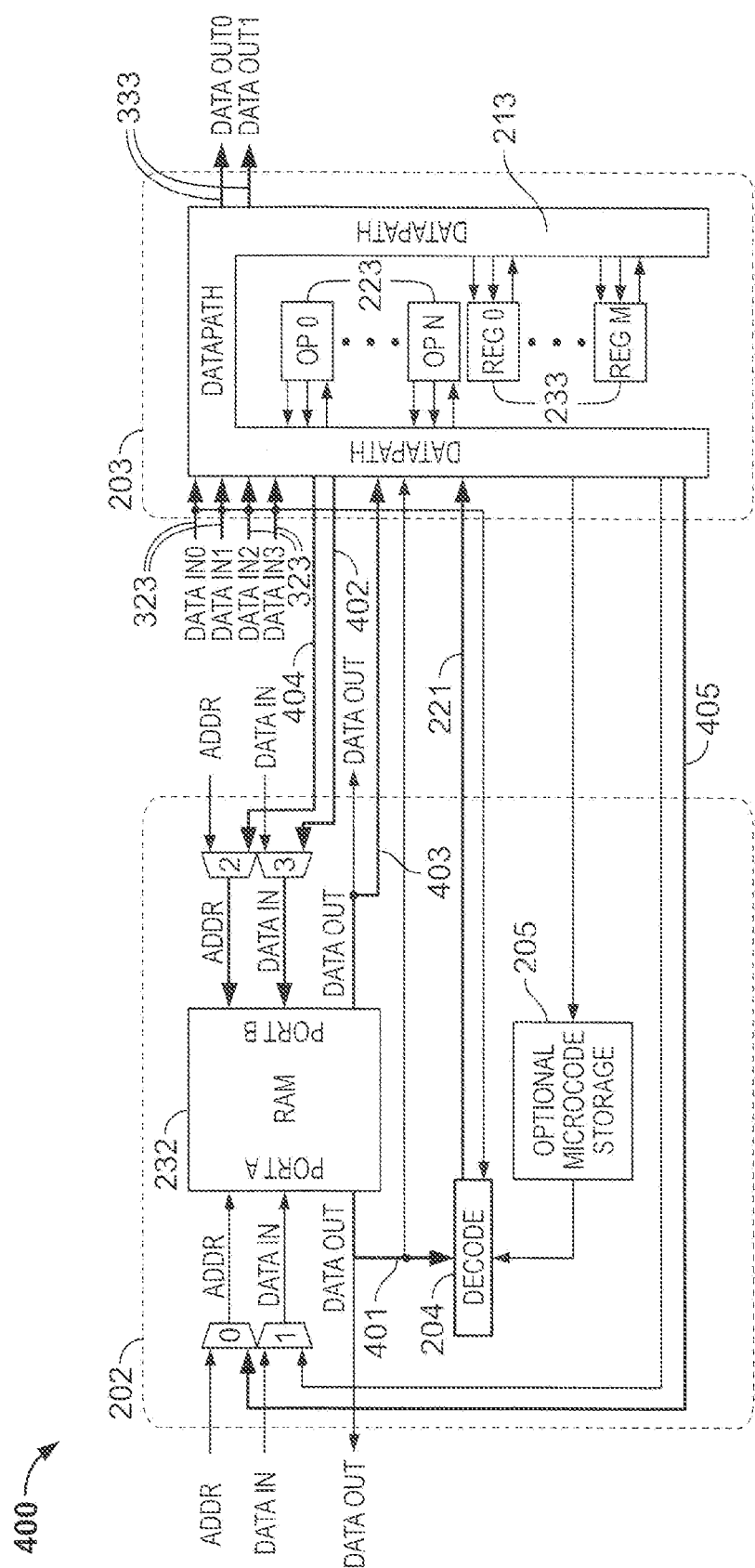
FIG. 4 shows a second example of a mode of operation of the structure of FIG. 2.

FIG. 4 shows how the structure of FIG. 2 is used in a "small processor" mode 400. In this mode, port A of memory unit 232 is used as an instruction memory for small processor 400 and port B of memory unit 232 is used as a data memory for small processor 400. Either memory unit 232 would be partitioned into an instruction memory and a data memory, or the compilation flow would ensure that data memory usage does not overwrite the instruction memory. Instructions are output from port A of memory unit 232 on path 401 and are decoded by decoder 204 into datapath control bits that are communicated to DSP block 203 via path 221 and determine the functionality of the operators 223 and registers 233 within DSP block 203. During execution of an instruction, DSP block 203 exchanges data with port B of memory unit 232 via input and output paths 402, 403 under control of address input path 404. When DSP block 203 completes execution of an instruction, it addresses the next instruction at port A of memory unit 232 via address input path 405. The processor 400 interacts with the rest of the system via input and output paths 323, 333 of DSP block 203.

Figure 5:
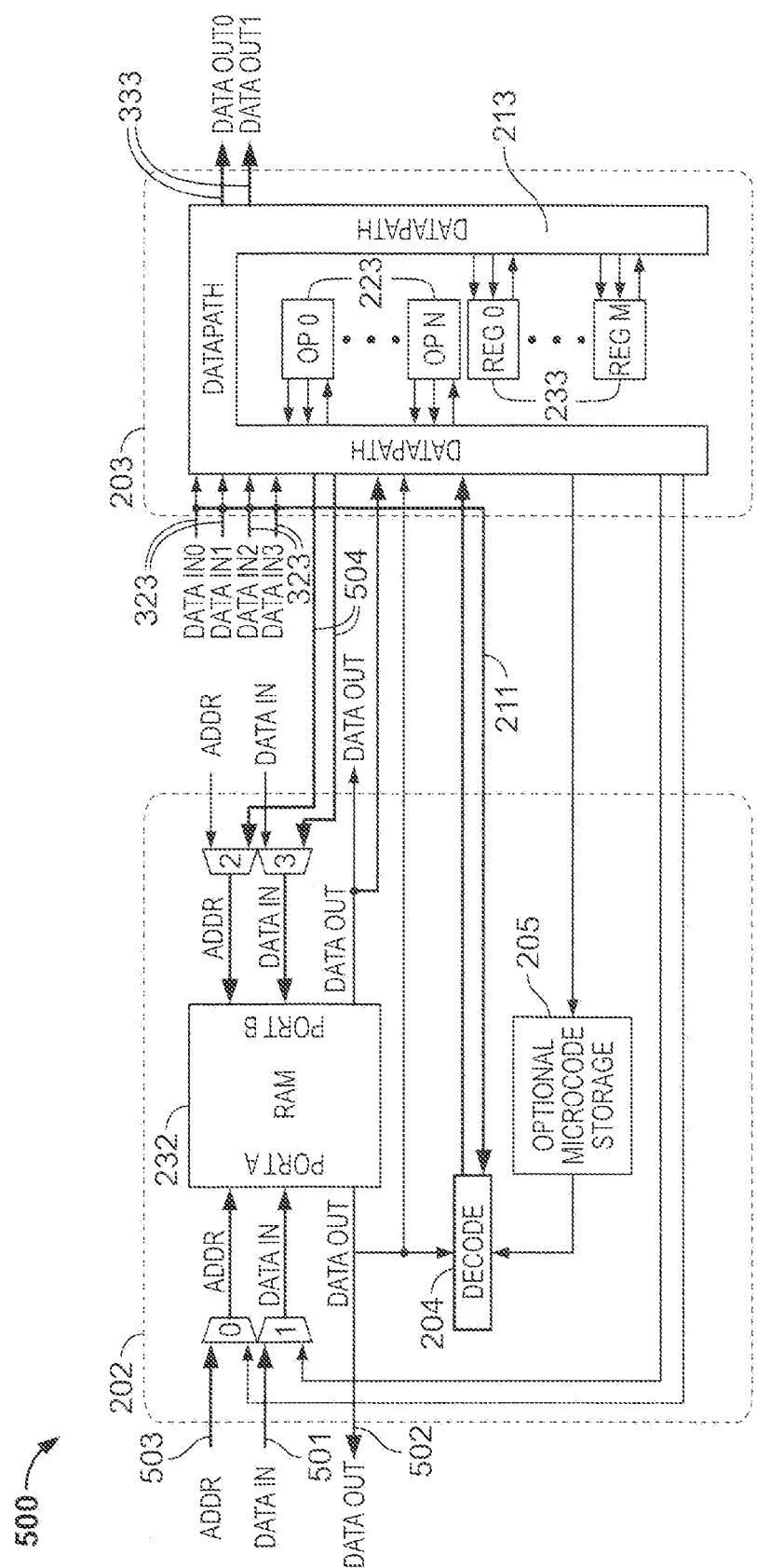
FIG. 5 shows a third example of a mode of operation of the structure of FIG. 2.

FIG. 5 shows how the structure of FIG. 2 is used in a "processor with external instruction supply" mode 500. In this mode, port A of memory unit 232 is connected to the general-purpose programmable logic of the device via data and address paths 501, 502, 503, while port B is used as data memory for the processing element 500. Instructions are supplied on the data input path 323 of DSP block 203, communicated via path 211 to decoder 204, decoded, and are returned via path 221 to control DSP datapath 213. The processor may communicate to the remainder of the device by writing to memory unit 232 via paths 504, or by sending output via the DSP output path 333.

Figure 6:
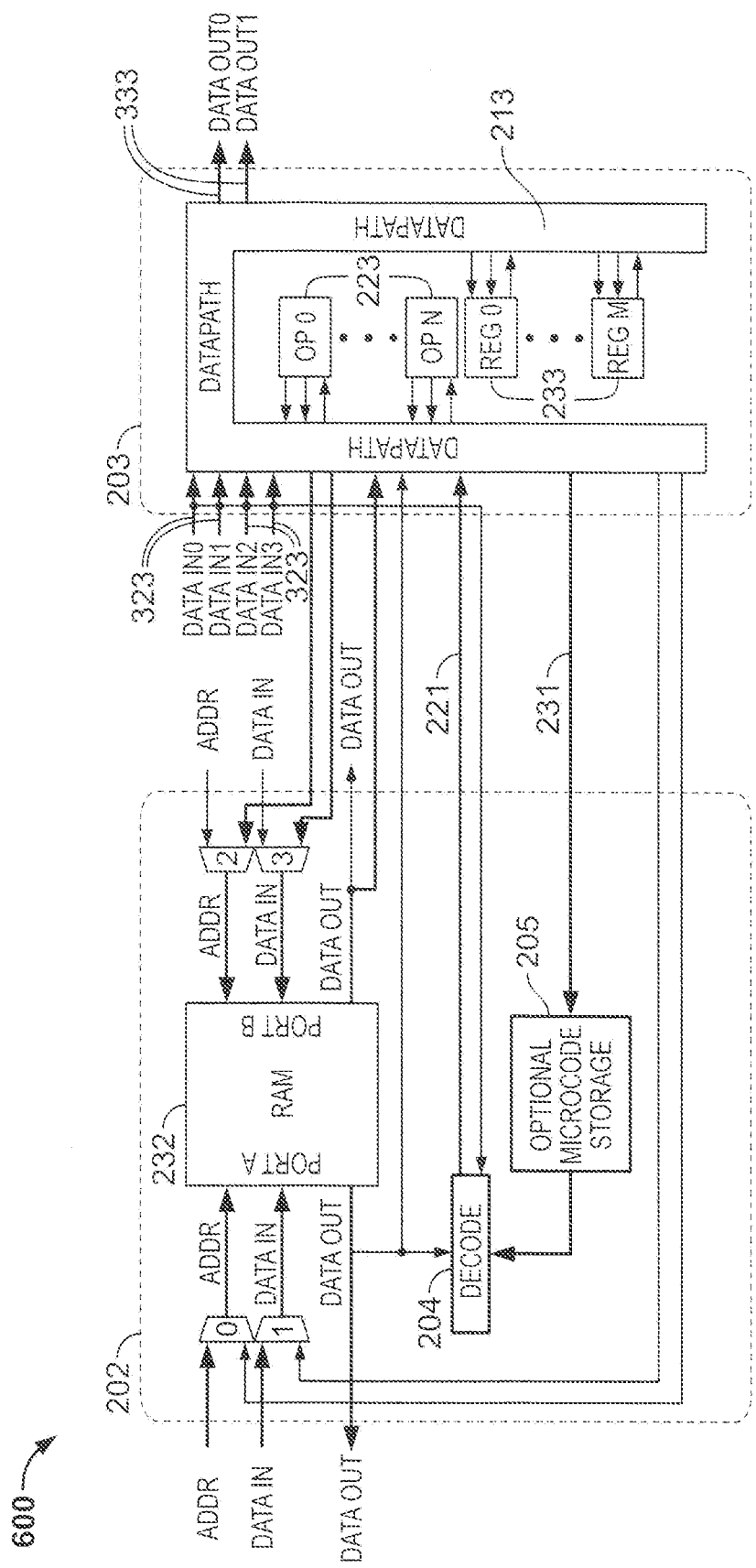
FIG. 6 shows a fourth example of a mode of operation of the structure of FIG. 2.

FIG. 6 shows how the structure of FIG. 2 is used in a "processor with internal instruction supply" mode 600. In this mode, data input and output paths 323, 333 of DSP block 203 communicate with the remainder of the device. Instructions are provided by the microcode storage 205, are decoded by decoder 204, and are used to control datapath 213 via path 221. When an instruction has been completed, datapath 213 addresses the next instruction in microcode storage 205 via path 231.

Thus it is seen that a programmable device structure that is particularly well-suited for the instantiation of processing elements has been provided.

Figure 7:
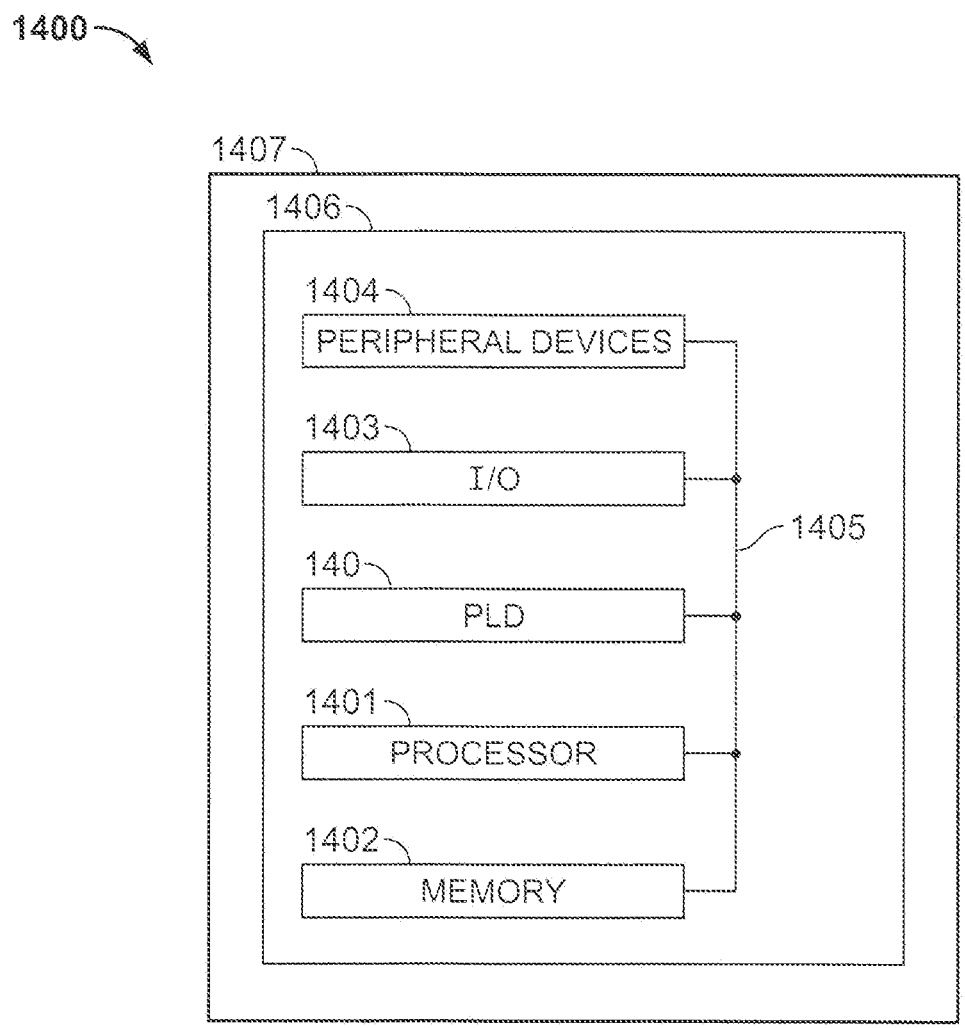
FIG. 7 is a simplified block diagram of an exemplary system employing a programmable logic device incorporating the present invention.

A PLD 140 incorporating specialized processing blocks according to embodiments of the present invention may be used in many kinds of electronic devices. One possible use is in an exemplary data processing system 1400 shown in FIG. 7. Data processing system 1400 may include one or more of the following components: a processor 1401; memory 1102; I/O circuitry 1403; and peripheral devices 1404. These components are coupled together by a system bus 1405 and are populated on a circuit board 1406 which is contained in an end-user system 1407.

System 1400 can be used in a wide variety of applications, such as computer networking, data networking, instrumentation, video processing, digital signal processing, Remote Radio Head (RRH), or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to a shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A programmable integrated circuit device comprising:
a plurality of clusters of programmable logic resources;
programmable device interconnect resources allowing user-defined interconnection between the clusters of programmable logic resources;
a plurality of specialized processing blocks having dedicated arithmetic operators and programmable internal interconnect resources, and having inputs and outputs programmably connectable to the programmable device interconnect resources;
a plurality of dedicated memory modules having inputs and outputs programmably connectable to the programmable device interconnect resources;
a programmably connectable direct interconnect between at least one specialized processing block of the plurality of specialized processing blocks and at least one dedicated memory module of the plurality of dedicated memory modules; and
at least one program instruction decoder programmably connectable to the at least one specialized processing block;
wherein when the programmably connectable direct interconnect is turned on:
the at least one specialized processing block and the at least one dedicated memory module collectively function as at least one processing element; and
the at least one program instruction decoder decodes one or more program instructions for execution by the at least on processing element;
wherein when the programmably connectable direct interconnect is turned off:
the at least one specialized processing block functions as at least one arithmetic operator; and
the at least one dedicated memory module functions as at least one independent memory.

2. The programmable integrated circuit device of claim 1 wherein:
the programmable connectable direct interconnect comprises a plurality of programmably connectable direct connections; and
each programmably connectable direct connection of the plurality of programmably connectable direct connections programmably connects a respective specialized processing block of the plurality of specialized processing blocks to a respective dedicated memory module of the plurality of dedicated memory modules.

3. The programmable integrated circuit device of claim 2 wherein the at least one specialized processing block is programmably connected to multiple programmably connectable direct connections of the plurality of programmably connectable direct connections.

4. The programmable integrated circuit device of claim 2 wherein the at least one dedicated memory module is programmably connected to multiple programmably connectable direct connections of the plurality of programmably connectable direct connections.

5. The programmable integrated circuit device of claim 2 wherein the at least one specialized processing block and the at least one dedicated memory module are located adjacent one another.

6. The programmable integrated circuit device of claim 5 wherein:
the programmable integrated circuit device is arranged in a rectilinear floorplan of rows and columns, the clusters of programmable logic resources, the specialized processing blocks, and the dedicated memory modules being arranged in respective columns of the floorplan;
a column of the plurality of specialized processing blocks and a column of the plurality of dedicated memory modules are adjacent one another in the floorplan; and
the at least one specialized processing block and the at least one dedicated memory module are located, respectively, in the column of the plurality of specialized processing blocks and the column of the plurality of dedicated memory modules that are adjacent one another in the floorplan.

7. The programmable integrated circuit device of claim 1 wherein the at least one program instruction decoder is located within the at least one specialized processing block.

8. The programmable integrated circuit device of claim 1 wherein the at least one program instruction decoder is located within the at least one dedicated memory module.

9. The programmable integrated circuit device of claim 1 further comprising at least one instruction store programmably connectable to the at least one program instruction decoder.

10. The programmable integrated circuit device of claim 9 wherein the at least one instruction store is located within the at least one specialized processing block.

11. The programmable integrated circuit device of claim 9 wherein the at least one instruction store is located within the at least one dedicated memory module.

12. The programmable integrated circuit device of claim 1 wherein the at least one specialized processing block comprises:
a datapath; and
a plurality of arithmetic operators separate from the datapath, where each arithmetic operator of the plurality of arithmetic operators is independently programmably connectable to the datapath.

13. The programmable integrated circuit device of claim 12 wherein the at least one specialized processing block further comprises a plurality of registers, wherein each register of the plurality of registers is separate from the datapath and independently programmably connectable to the datapath.

14. A method of configuring a processing element in a programmable integrated circuit device having a plurality of clusters of programmable logic resources, programmable device interconnect resources allowing user-defined interconnection between the clusters of programmable logic resources, a plurality of specialized processing blocks having dedicated arithmetic operators and programmable internal interconnect resources, and having inputs and outputs programmably connectable to the programmable device interconnect resources, a plurality of dedicated memory modules having inputs and outputs programmably connectable to the programmable device interconnect resources, and programmably connectable direct interconnect between at least one specialized processing block of the plurality of specialized processing blocks and at least one dedicated memory module of the plurality of dedicated memory modules, the method comprising:
programmably connecting a direct connection between the at least one specialized processing block and the at least one dedicated memory modules to form at least one processing element;
decoding one or more program instructions for execution by the at least one processing element using a program instruction decoder; and
programmably disconnecting the direct connection between the at least one specialized processing block and the at least one dedicated memory modules, such that the at least one specialized processing block functions as at least one arithmetic operator and the at least one dedicated memory module functions as at least one independent memory.

15. The method of claim 14 wherein the at least one specialized processing block and the at least one dedicated memory module are adjacent to one another.

16. The method of claim 15 wherein:
the programmable integrated circuit device is arranged in a rectilinear floorplan of rows and columns, the clusters of programmable logic resources, the specialized processing blocks, and the dedicated memory modules being arranged in respective columns of the floorplan; and
the at least one specialized processing block and the at least one the dedicated memory module are in adjacent columns of the floorplan.

17. The method of claim 16 wherein the at least one specialized processing block and the at least one dedicated memory module are in a common row of the adjacent columns of the floorplan.

18. The method of claim 16 wherein the at least one specialized processing block and the at least one dedicated memory module are in adjacent rows of the adjacent columns of the floorplan.

19. The method of claim 14 further comprising storing instructions for the program instruction decoder in the at least one dedicated memory module.

20. The method of claim 14 further comprising:
programmably connecting a second direct connection between the program instruction decoder and a dedicated instruction store; and
storing the one or more program instructions in the dedicated instruction store.

21. The method of claim 14 further comprising programmably connecting independent connections of a plurality of arithmetic operators to a datapath of the at least one specialized processing block.

22. The method of claim 21 further comprising programmably connecting at least one independent connection of at least one register to the datapath of the at least one specialized processing block.

23. A specialized processing block for a programmable integrated circuit device, said specialized processing block comprising:
a datapath; and
a plurality of arithmetic operators separate from the datapath, wherein each arithmetic operator of the plurality of arithmetic operators is programmably independently connectable to the datapath;
wherein the specialized processing block is programmably connectable to a dedicated memory module of the programmable integrated circuit device via a programmably connectable direct interconnect;
wherein when the programmably connectable direct interconnect is turned on:
the specialized processing block and the dedicated memory module collectively function as a processing element; and
at least one arithmetic operator of the plurality of arithmetic operators is programmably connected to the datapath;
wherein when the programmably connectable direct interconnect is turned off:
the specialized processing block functions as at least one arithmetic operator; and
the at least one arithmetic operator is programmably disconnected from the datapath.

24. The specialized processing block of claim 23 further comprising a plurality of registers separate from the datapath and programmably independently connectable to the datapath;
wherein when the programmably connectable direct interconnect is turned on, at least one register of the plurality of registers is programmably connected to the datapath; and
wherein when the programmably connectable direct interconnect is turned off, the at least one register of the plurality of registers is programmably disconnected to the datapath.

* * * * *